United States Patent

Anthony et al.

[11] Patent Number: 5,437,728
[45] Date of Patent: Aug. 1, 1995

[54] APPARATUS AND METHOD FOR CHEMICAL VAPOR DEPOSITION OF DIAMOND

[75] Inventors: Thomas R. Anthony, Niskayuna; James F. Fleischer, Scotia; Robert H. Ettinger, Schenectady, all of N.Y.

[73] Assignee: General Electric Company, Schenectady, N.Y.

[21] Appl. No.: 364,568

[22] Filed: Dec. 27, 1994

Related U.S. Application Data

[60] Division of Ser. No. 261,358, Jun. 13, 1994, which is a continuation-in-part of Ser. No. 194,958, Feb. 14, 1994, abandoned.

[51] Int. Cl.6 .............................................. C23C 16/00
[52] U.S. Cl. ................................... 118/724; 118/715; 118/729
[58] Field of Search .................... 118/724, 729, 715

[56] References Cited

U.S. PATENT DOCUMENTS

| 4,056,208 | 11/1977 | Prejean | 428/415 |
| 4,816,286 | 3/1989 | Hirose | 427/255.1 |
| 4,953,499 | 9/1990 | Anthony et al. | 118/724 |

OTHER PUBLICATIONS

Aikyo et al., "Diamond Synthesis Suppressing the Thermal Decomposition of Methane in a Hot-Filament CVD", Jpn. J. Appl. Phys. 28(9), Sep. 1989, pp. L1631-L1633.

Primary Examiner—Richard Bueker
Attorney, Agent, or Firm—William H. Pittman

[57] ABSTRACT

Diamond is produced by chemical vapor deposition on a substrate by hot filament activation of a hydrogen-hydrocarbon gas mixture. An edge of the substrate faces the filament at a distance therefrom up to about 1 mm and preferably about 0.3–0.7 mm., and the substrate is moved relative to the filament to maintain this spacing as diamond forms thereon. Diamond formation proceeds at an improved rate, and in single crystal configuration under certain conditions.

11 Claims, 4 Drawing Sheets

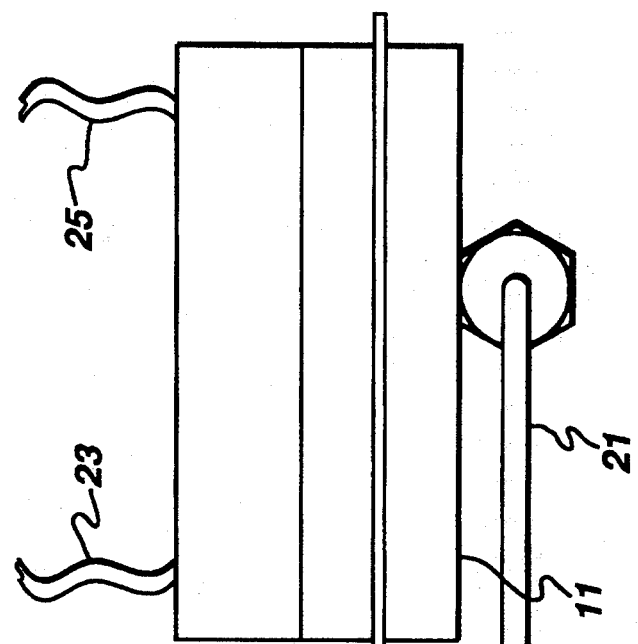
fig. 2
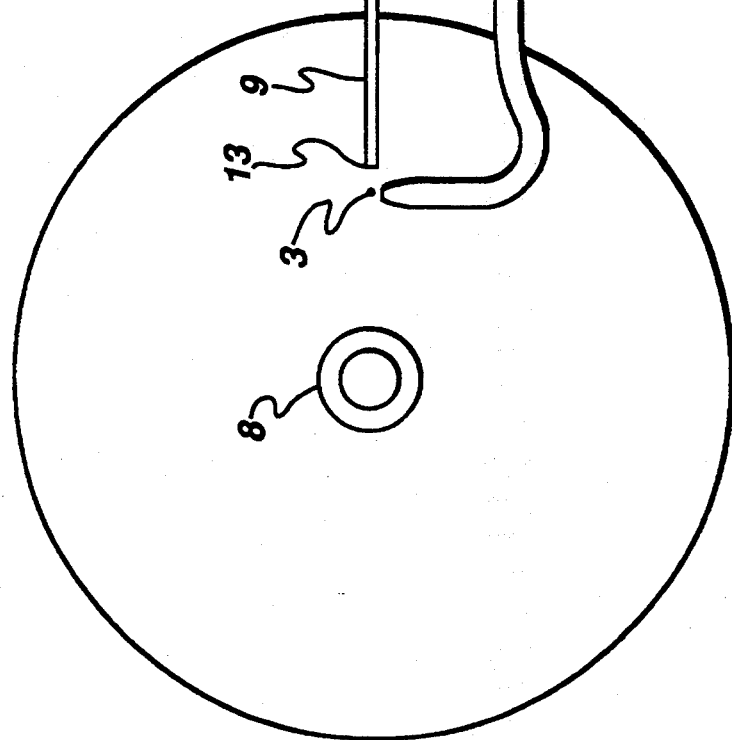
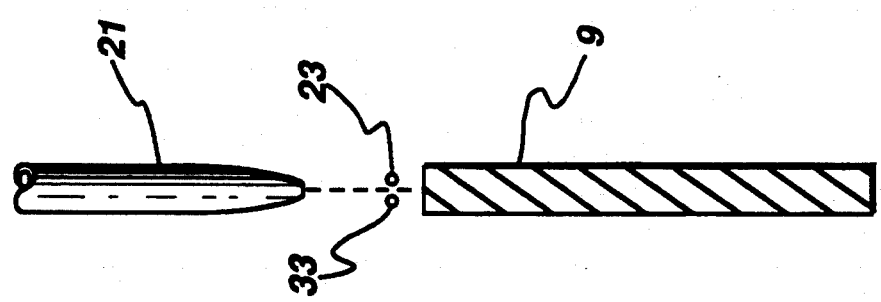
fig. 3

APPARATUS AND METHOD FOR CHEMICAL VAPOR DEPOSITION OF DIAMOND

CROSS-REFERENCE TO RELATED APPLICATIONS

This application is a division of application Ser. No. 08/261,358 filed Jun. 13, 1994, which application is a continuation-in-part of application Ser. No. 08/194,958, filed Feb. 14, 1994, now abandoned.

FIELD OF THE INVENTION

This invention relates to the production of diamond by chemical vapor deposition, and more particularly to an apparatus and method for rapid and efficient production thereof.

Diamond production by chemical vapor deposition (hereinafter sometimes "CVD") is well known. It involves activation at relatively low pressure of a mixture of hydrogen and a gaseous hydrocarbon followed by passage of the gaseous mixture into contact with a substrate. The hydrogen gas is converted to atomic hydrogen which reacts with the hydrocarbon to form active gaseous carbon species, which in turn adsorb on the substrate and react to form polycrystalline diamond. A number of types of activation may be employed, including thermal activation which, in the "filament method", is typically effected by means of one or more wires or filaments heated, under prior art conditions, to a temperature in the range of about 2000°–2100° C.

In typical filament methods for diamond production by CVD, a side of the substrate faces a single filament or an array of filaments at a distance of about 5–15 mm. At filament temperatures in the above range, substrate temperatures in the range of about 600°–800° C. are typical and a diamond growth rate of about 0.5 micron per hour is generally observed.

Much higher growth rates of diamond can be obtained by moving the filament(s) closer to the substrate. For example, at a filament-substrate difference of 1 mm. or less a growth rate greater than 10 microns per hour is possible. Such distances can, however, only be achieved in very small experimental-size reactors. Upon scale-up, problems arise which are exacerbated by the use of long filaments in commercial scale operations. These problems include filament-substrate shorting caused by carburization and irregular expansion of the filament until it contacts the substrate, gas starvation between the filament and the substrate and excessive substrate temperatures. Moreover, it is impossible to maintain a small and constant filament-substrate distance as the diamond film grows on the substrate.

In addition to higher growth rates, efforts have also been directed to the production of single crystal diamond by CVD methods. For example, homoepitaxial and heteroepitaxial methods have been attempted for this purpose. Such methods have not, however, been uniformly successful.

SUMMARY OF INVENTION

The present invention is based on the discovery that an "edge-on" positioning of the substrate with respect to the filament, with movement of the substrate away from the filament as the diamond grows thereon, permits much closer spacing of the filament and substrate and materially increases the rate of diamond formation. Such positioning also permits, under certain conditions defined hereinafter, production of CVD diamond which is predominantly single crystal in growth pattern. Related discoveries include a multiple filament design with positioning of the gas inlet so as to maximize gas concentration between filament and substrate, further optimizing diamond formation.

In one of its aspects, the invention is directed to apparatus for chemical vapor deposition of diamond, comprising:

at least one filament resistant to temperatures up to about 2500° C., at least one substrate capable of receiving a diamond coating, means for holding said substrate with an edge facing said filament at a distance therefrom up to about 1 mm., and for continuously moving said substrate relative to said filament, means for heating said filament, means for supplying a gas to contact said filament and substrate, and an enclosure adapted to maintain said filament and substrate at subatmospheric pressure.

Another aspect of the invention is a method for depositing diamond by chemical vapor deposition on a substrate which comprises:

positioning said substrate with an edge facing at least one filament at a distance therefrom up to about 1 mm., heating said filament to a temperature in the range of about 1800°–2500° C., maintaining said substrate at a pressure lower than atmospheric and passing a mixture of hydrogen and a hydrocarbon gas into contact with said filament and substrate, whereby diamond forms on the edge of said substrate, and moving said substrate relative to said filament to maintain a space of up to about 1 mm. between said filament and the diamond formed on said substrate.

BRIEF DESCRIPTION OF THE DRAWINGS

In the drawings,

FIG. 2 is a cutaway view along the line 2—2 of FIG. 1.

FIG. 3 is a schematic cutaway view of an alternative apparatus employing multiple filaments.

DETAILED DESCRIPTION; PREFERRED EMBODIMENTS

Figure 1:
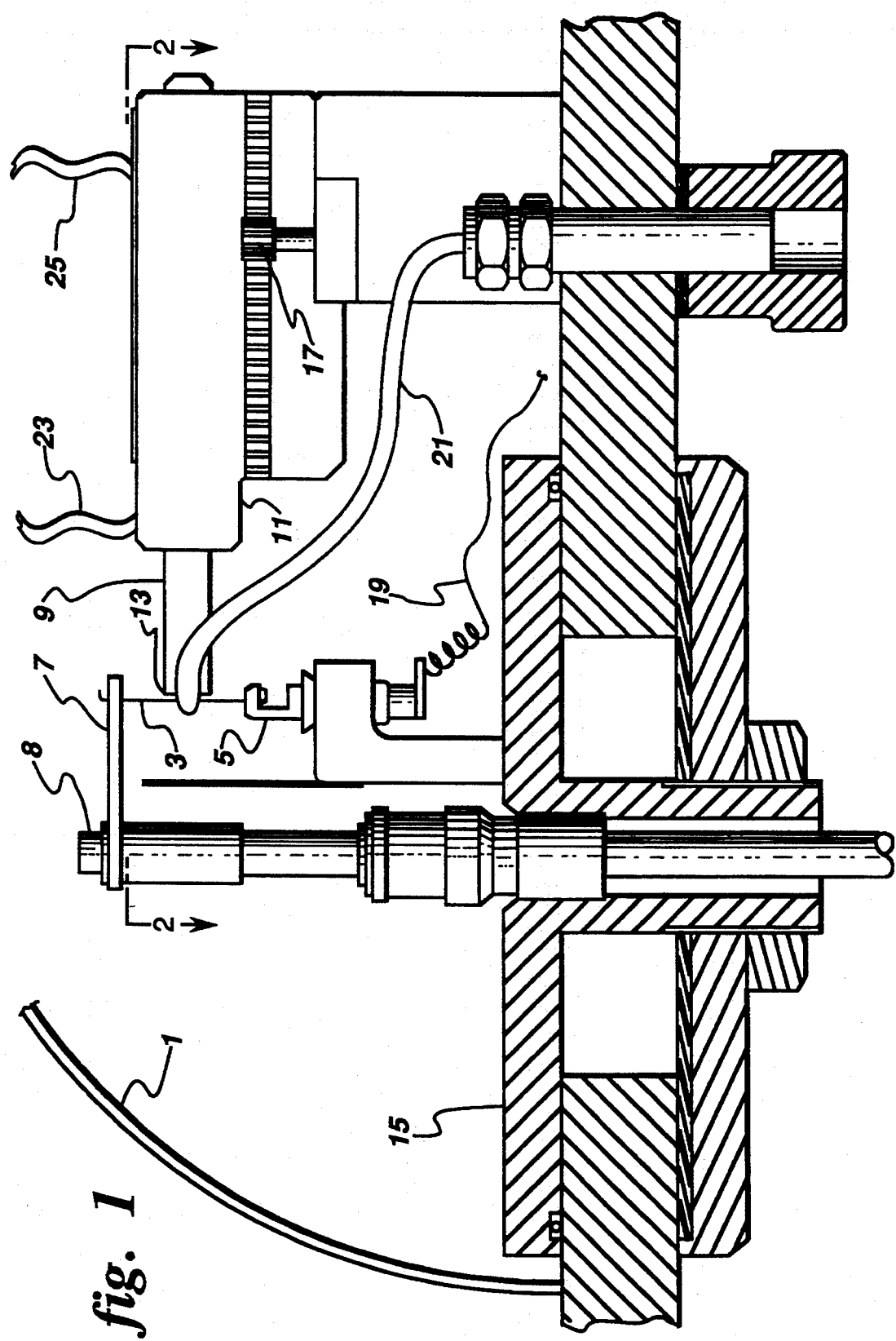
FIG. 1 is a cross-sectional view of an illustrative apparatus according to the invention.

Reference is made to FIGS. 1 and 2 which depict one embodiment of the apparatus of the invention. The diamond-producing elements of said apparatus are enclosed in enclosure 1 (cut away because of lack of space) which is vacuum-tight and thus capable of being maintained at reduced pressure, typically on the order of 10 torr. Appropriate portions of the apparatus which are present in enclosure 1 are constructed of heat-resistant materials, as necessary to withstand exposure to filament temperatures up to about 2500° C. and substrate temperatures up to about 1000° C. Quartz, for example, is an illustrative non-conductive heat-resistant material suitable for said enclosure.

Filament 3 is supported by clamp 5 and clamp 7 attached to post 8. Said filament is made of a heat-resistant material such as metallic tungsten, tantalum, molybdenum or rhenium. Because of its relatively low cost and particular suitability, tungsten is often preferred. As shown, filament 3 is in a vertical position, but it is within the scope of the invention for said filament to be horizontal or in another position.

Filament 3 is shown as being cylindrical in shape. However, other shapes including ribbon shapes may be employed. Filament thicknesses (diameters in the case of cylindrical filaments) of about 0.2–1.0 mm. are typical, with about 0.4–0.8 mm. frequently being preferred.

Substrate 9 is of a refractory material suitable for diamond deposition. Examples of such materials are carbide forming metals such as molybdenum, silicon, tantalum and niobium as well as combinations thereof (including coatings on other refractory materials). Metallic molybdenum substrates are particularly suitable and are generally preferred.

The size of the substrate is not critical in most respects. Satisfactory diamond has been produced at a satisfactory rate at substrate thickness on the order of 3 mm.

Figure 5A:
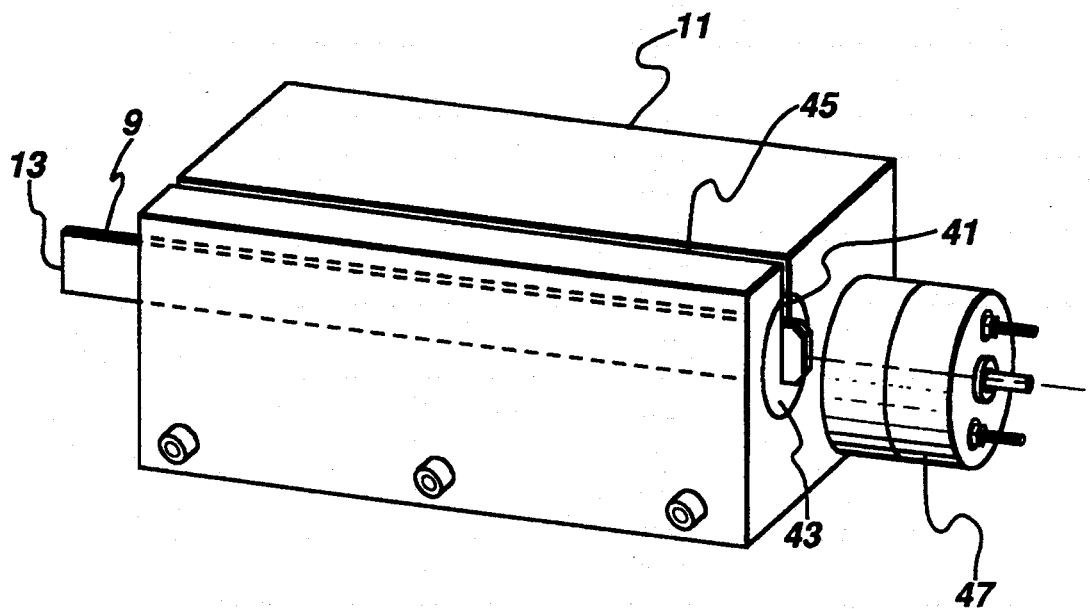
FIGS. 5a and 5b are views of an alternative embodiment of the substrate holder of the FIG. 1 apparatus, particularly useful for producing single crystal diamond.
Figure 5B:
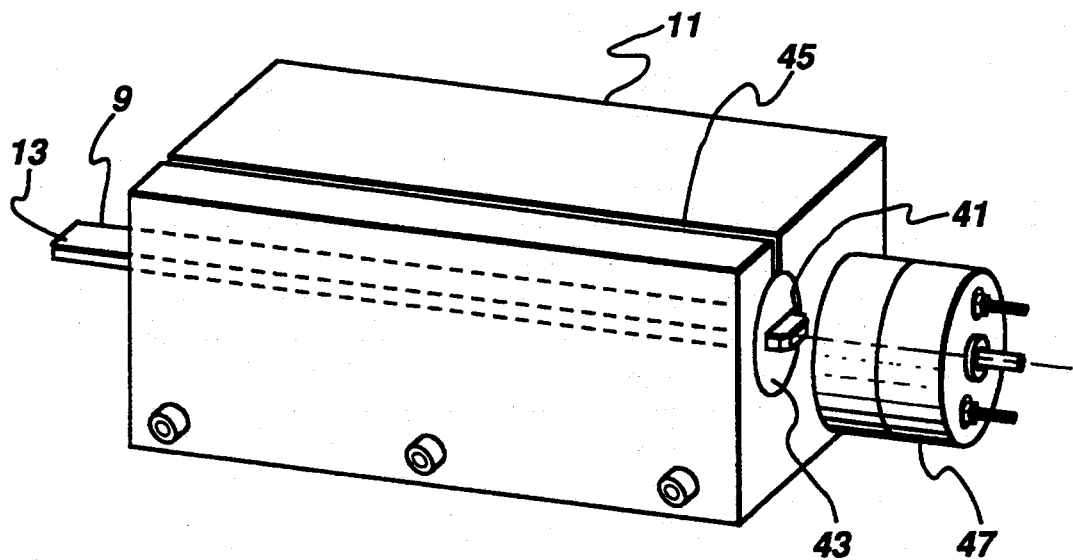

As shown in FIGS. 1 and 2, an essential feature of the invention is the positioning of substrate 9 relative to filament 3. Said substrate is disposed via holder 11 with an edge 13 facing said filament. In said figures, said edge is shown as parallel to said filament. However, it is also contemplated for the edge and the filament to define another angle, usually perpendicular as shown in FIG. 5b and discussed in detail hereinafter.

The spacing between edge 13 and filament 3 is up to about 1 mm. typically in the range of about 0.25–1 and preferably about 0.3–0.7 mm. Spacing less than about 0.25 mm. can lead to gas starvation between the substrate and filament, decreasing the rate of diamond deposition.

Substrate holder 11 is capable of continuous movement relative to filament 3. This may be accomplished by making substrate holder 11, the filament assembly (including filament 3, clamps 5 and 7 and post 8), or both, moveable units. In the embodiment shown in FIG. 1, both are capable of movement, the filament assembly via sliding stage 15 and substrate holder 11 via rack-and-piston system 17. Preferably, substrate holder 11 includes substrate cooling means, shown as a heat sink supplied with cooling water via water input 23 and outlet 25.

Filament 3 is equipped with electrical connections to provide heating thereto. As shown in FIG. 1, these include lead 19 and a further lead (not shown) connected to post 8.

Gas is supplied to the CVD apparatus for diamond growth via gas line 21, which terminates at a location proximate to filament 3 and substrate edge 13.

In operation for chemical vapor deposition of diamond, the interior of enclosure 1 is brought to the desired subatmospheric pressure. Filament 3 and edge 13 of substrate 9 are maintained in the depicted positions and at the aforementioned distance, and filament 3 is heated to a temperature on the order of 1800°–2500° C. A mixture of hydrogen and a hydrocarbon gas, typically methane, typically comprising about 1–5% and preferably about 1.5% by volume hydrocarbon based on total gases, is supplied through line 21. Said gases are activated by said heated filament, whereupon diamond forms on edge 13 of substrate 9.

If diamond formation were allowed to proceed without movement of the substrate or filament, the diamond would ultimately contact the filament with possible catastrophic results. To avoid this, substrate 9, filament 3 or both are moved to maintain the aforementioned distance between the filament and the diamond formed on said substrate. Such movement may be achieved manually to a degree determined by visual observation, as with a video camera. However, it is generally preferred to employ computer means to program the movement in accordance with the experimentally determined rate of diamond formation. For this purpose, the actual distance from the filament to the substrate or diamond formed thereon can be determined by laser scanning. Suitable computer means and programs therefor can easily be developed by those skilled in the art.

In determining the substrate movement relative to the filament, the filament and substrate temperatures will be important factors. Filament temperatures may be determined in terms of the amount of power supplied to the filament. Substrate temperatures may be measured at a suitable distance from edge 13, and extrapolated to said edge by considering known conduction and radiation factors and the temperature of the heat sink at the other end of the substrate.

It has been determined that deposition of diamond according to the method of this invention on a molybdenum substrate, the edge of said substrate maintained at a distance of 0.3 mm. from a tungsten filament, is at least 16 and often more than 20 times as fast as the rate of diamond deposition on a similar conventionally positioned substrate at a distance of 10 mm. from a similar filament. Thus, the invention in its simplest form materially increases the rate of diamond formation.

The method of the invention may find particular utility in the production of diamond wire drawing dies, which typically are essentially cubical with dimensions on the order of 1 mm. However, larger sheets of diamond may also be produced by said method, and have integrity comparable to conventionally produced sheets.

Another anticipated advantage of the present invention may make even more rapid diamond formation possible. It is a result of the fact that contamination of the CVD diamond by vaporized filament metal is inversely proportional to the rate of diamond deposition. Since the vaporization rate is a function only of the filament temperature, it is possible to raise said temperature to a level, for example, in the range of about 2000°–2500° C. and hence increase the deposition rate without increasing metal contamination of the deposited diamond.

A disadvantage sometimes encountered with the embodiment of FIGS. 1 and 2, especially under the high growth rate conditions provided thereby, is gas starvation in the area between the filament and substrate. The embodiment shown in FIG. 3 solves this problem. It includes two filaments 23 and 33 in a plane perpendicular to that of substrate 9, with gas line 21 positioned on the opposite side of said filaments from said substrate. This design provides gas directly between said filaments, and maintains a high concentration thereof in the area of diamond growth.

Figure 4:
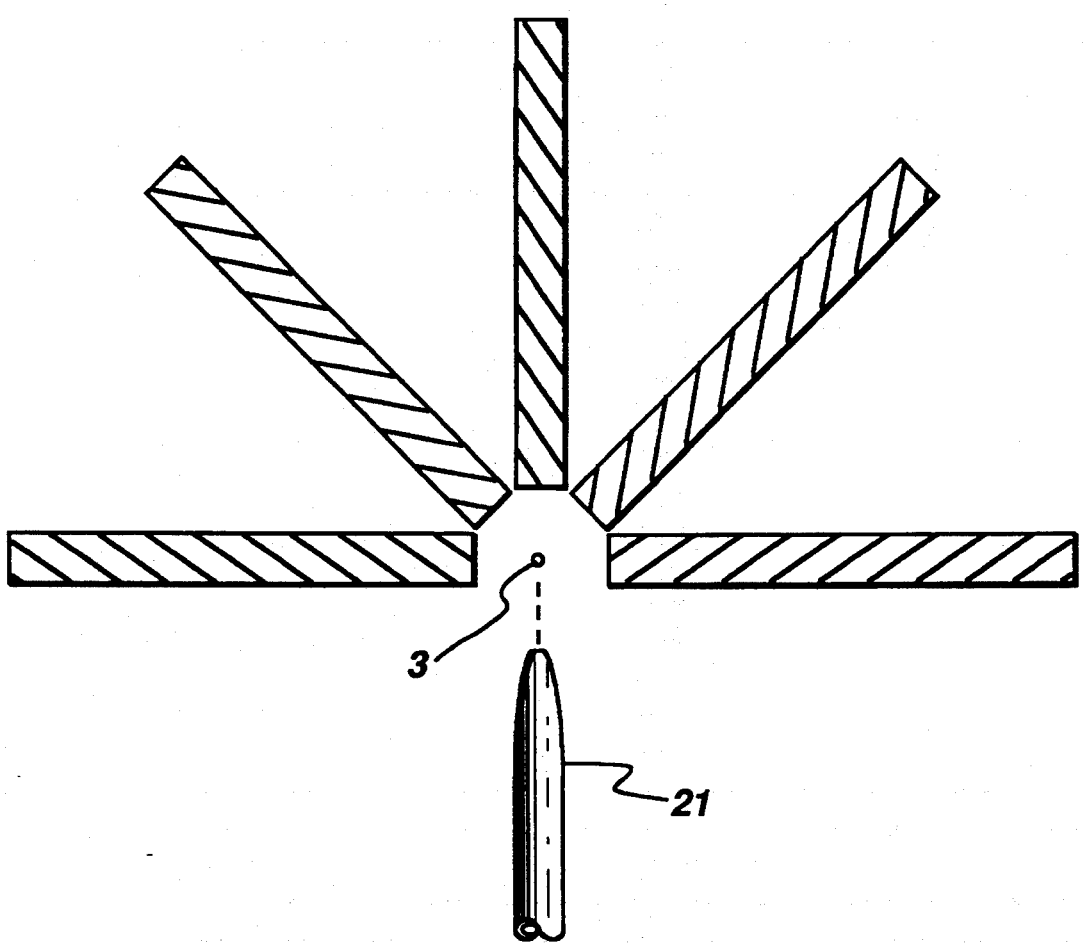
FIG. 4 is a similar view of an alternative apparatus employing multiple substrates.

Still another embodiment of the invention is shown in FIG. 4. It includes a plurality of substrates and a single filament 3. Such a design substantially increases the amount of diamond that can be produced using a single filament.

Further acceleration of diamond formation may be achieved by chemical means, such as the addition of a minor proportion of oxygen to the hydrogen-hydrocarbon gas mixture.

In an alternative embodiment of the invention, the substrate holder is adapted to rotate the substrate between positions in which its edge is perpendicular and parallel to the filament. This embodiment is shown in FIGS. 5a and 5b, with substrate 9 in each position. Said substrate fits in slot 41 in rotatable cylinder 43. In the parallel position (FIG. 5a), slot 41 is aligned with slot 45 in substrate holder 11. In FIG. 5b, cylinder 41 has been rotated from said position to the position at right angles thereto. Rotation may be effected by conventional rotating means, shown as including rotary solenoid 47 which may be electrically attached to a suitable controlling unit outside enclosure 1.

It has been found that the diamond grown in accordance with the present invention, and particularly the embodiment shown in FIGS. 5a and 5b, is predominantly single crystal when the length of edge 13 of substrate 9 is approximately equal to the thickness of said substrate, and especially when the substrate cross-section is cylindrical. Initial growth on the substrate edge is microcrystalline, but as growth continues all the crystals except one are terminated and, under the aforementioned length and thickness conditions, growth continues for a single crystal only.

It is possible to create a large sheet of single crystal diamond on a substrate having a proportionally longer growth edge by initiating growth while the substrate is in the position shown in FIG. 5b; that is, the substrate is perpendicular to the filament. In this position, the diamond growth area is limited to the center of the substrate. As the substrate is withdrawn from the filament with continuing growth, single crystal growth is initiated. The substrate may then be turned to the parallel position shown in FIG. 5a, by any suitable mechanism such as the rotary solenoid shown. With continued withdrawal of the substrate from the filament, diamond growth fans out and a sheet of predominantly single crystal diamond is formed.

In a preferred embodiment of the method of the invention, therefore, diamond growth is initiated with the substrate perpendicular to the filament and the substrate is rotated to a position parallel to said filament upon commencement of single crystal diamond growth.

What is claimed is:

1. Apparatus for chemical vapor deposition of diamond, comprising:
    at least one filament resistant to temperatures up to about 2500° C.,
    at least one substrate capable of receiving a diamond coating,
    means for holding said substrate with an edge facing said filament at a distance therefrom up to about 1 mm., and for continuously moving said substrate relative to said filament,
    means for heating said filament,
    means for supplying a gas to contact said filament and substrate, and
    an enclosure adapted to maintain said filament and substrate at subatmospheric pressure.

2. Apparatus according to claim 1 wherein the distance between said substrate and filament is in the range of about 0.25–1 mm.

3. Apparatus according to claim 2 wherein said means for holding said substrate includes substrate cooling means.

4. Apparatus according to claim 2 wherein said filament is of tungsten.

5. Apparatus according to claim 2 wherein said substrate is of molybdenum.

6. Apparatus according to claim 2 wherein the distance between said substrate and filament is in the range of about 0.3–0.7

7. Apparatus according to claim 2 wherein said filament is cylindrical.

8. Apparatus according to claim 1 comprising at least two filaments in a plane perpendicular to that of said substrate and having said gas supply means on the opposite side of said filaments from said substrate.

9. Apparatus according to claim 1 comprising a single filament and a plurality of substrates.

10. Apparatus according to claim 1 wherein said edge of said substrate is parallel to said filament.

11. Apparatus according to claim 1 wherein said means for holding said substrate is adapted to rotate said substrate between positions in which its edge is perpendicular and parallel to said filament.

* * * * *